(12) United States Patent
Ardehali

(10) Patent No.: US 7,782,111 B2
(45) Date of Patent: Aug. 24, 2010

(54) NARROW PULSE GENERATOR

(75) Inventor: Mohammad Ardehali, Camarillo, CA (US)

(73) Assignee: Tialinx, Inc., Irvine, CA (US)

( * ) Notice: Subject to any disclaimer, the term of this patent is extended or adjusted under 35 U.S.C. 154(b) by 121 days.

(21) Appl. No.: 11/968,072

(22) Filed: Dec. 31, 2007

(65) Prior Publication Data

US 2009/0167392 A1    Jul. 2, 2009

(51) Int. Cl.
 *G06F 1/04* (2006.01)
(52) U.S. Cl. ........................... 327/291; 327/298
(58) Field of Classification Search .............. None
See application file for complete search history.

(56) References Cited

U.S. PATENT DOCUMENTS 5,587,679 A * 12/1996 Imamura ................. 327/170
6,118,798 A *  9/2000 Ema et al. ............. 372/29.011
6,424,379 B1 *  7/2002 Itabisashi ................ 348/525
7,274,244 B2 *  9/2007 Fang et al. ............... 327/407

* cited by examiner

*Primary Examiner*—Cassandra Cox
(74) *Attorney, Agent, or Firm*—Haynes & Boone, LLP.

(57) ABSTRACT

A pulse generator is provided that includes: a current source, a source follower whose output controls the gate of a FET and a differential stage whose input voltage consists of inverting square waves and its output voltage consists of extremely narrow pulses widths, for example, of 30 to 40 ps and amplitude of 1.5 Volts.

15 Claims, 5 Drawing Sheets

NARROW PULSE GENERATOR

TECHNICAL FIELD

The present invention relates generally to pulse generation and more particularly to ultra-wideband pulse generation.

BACKGROUND

The generation of narrow pulses occurs in a variety of fields including ultra-wideband (UWB) radios/radars and "Clock Data Recovery" (CDR) circuits. For example, ultra-wideband radios transmit information using narrow pulses with very small duty cycles. In this fashion the signal spectrum extends over a large bandwidth and can be buried in the ambient noise in a way that does not interfere with other services. Another important application of narrow pulses is in CDR circuits which retime the received data and remove the jitter accumulated during data transmission. For example, the random binary data obtained by optical receivers can not provide any direct information about the clock since it contains no spectral line at the bit rate. To create a frequency component at the bit rate, the data must undergo differentiation and rectification, which is also called "edge detection". To realize differentiation and rectification in CDR integrated circuits, it is necessary to create short pulses during each data transition.

In general, the narrower the pulse that is generated, the more "ultra-wideband" is the resulting signal spectrum. Current state-of-the-art pulse generators are considered ultra-wideband with pulse widths in the hundreds of pico-seconds. But for certain high-frequency data transmission applications, such a pulse width is too broad. Moreover, an UWB radar increases its range resolution as the pulse width is narrowed.

Accordingly, there is a need in the art for improved UWB pulse generators.

SUMMARY

In accordance with an aspect of the invention, a pulse generator is provided that includes: a differential pair of transistors coupled between a first node and a second node, wherein a first one of the transistors in the pair has its gate driven by a voltage Vip that transitions periodically between a power supply voltage and wherein a remaining one of the transistors has its gate driven by a voltage Vin that is complementary to voltage Vip; a first current source that biases a current that flows between the first and second nodes; and a third transistor coupled between the first current source and the second node, wherein the third transistor is matched to the differential pair of transistors and driven by a level-shifted version of Vip, whereby as Vip is periodically brought low, a voltage pulse occurs at the first and second nodes, and whereby as Vin is periodically brought low, a voltage pulse also occurs at the first and second nodes.

In accordance with another aspect of the invention, a method of generating pulses for a circuit is provided. The circuit includes a differential pair of transistors coupled between a first node and a second node, a first current source that biases a current that flows between the first and second nodes, and a third transistor coupled between the current source and the second node, wherein the third transistor is matched to the differential pair of transistors. The method comprises the acts of: driving a gate of a first one of the transistors in the differential pair with a first square wave voltage that oscillates between ground and a power supply voltage while driving a gate of a remaining one of the transistors in the differential pair with a second square wave voltage that is complementary to the first square wave voltage; and driving a gate of the third transistor with a level-shifted version of the first square wave voltage, the level-shifting being such that the gate of the third transistor oscillates between a voltage lower than the power supply voltage and ground synchronously with the voltage oscillation at the gate of the first one of the transistor in the differential pair.

In accordance with another aspect of the invention, the pulse generator can be used for edge detection in CDR circuits.

The invention will be more fully understood upon consideration of the following detailed description, taken together with the accompanying drawings.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
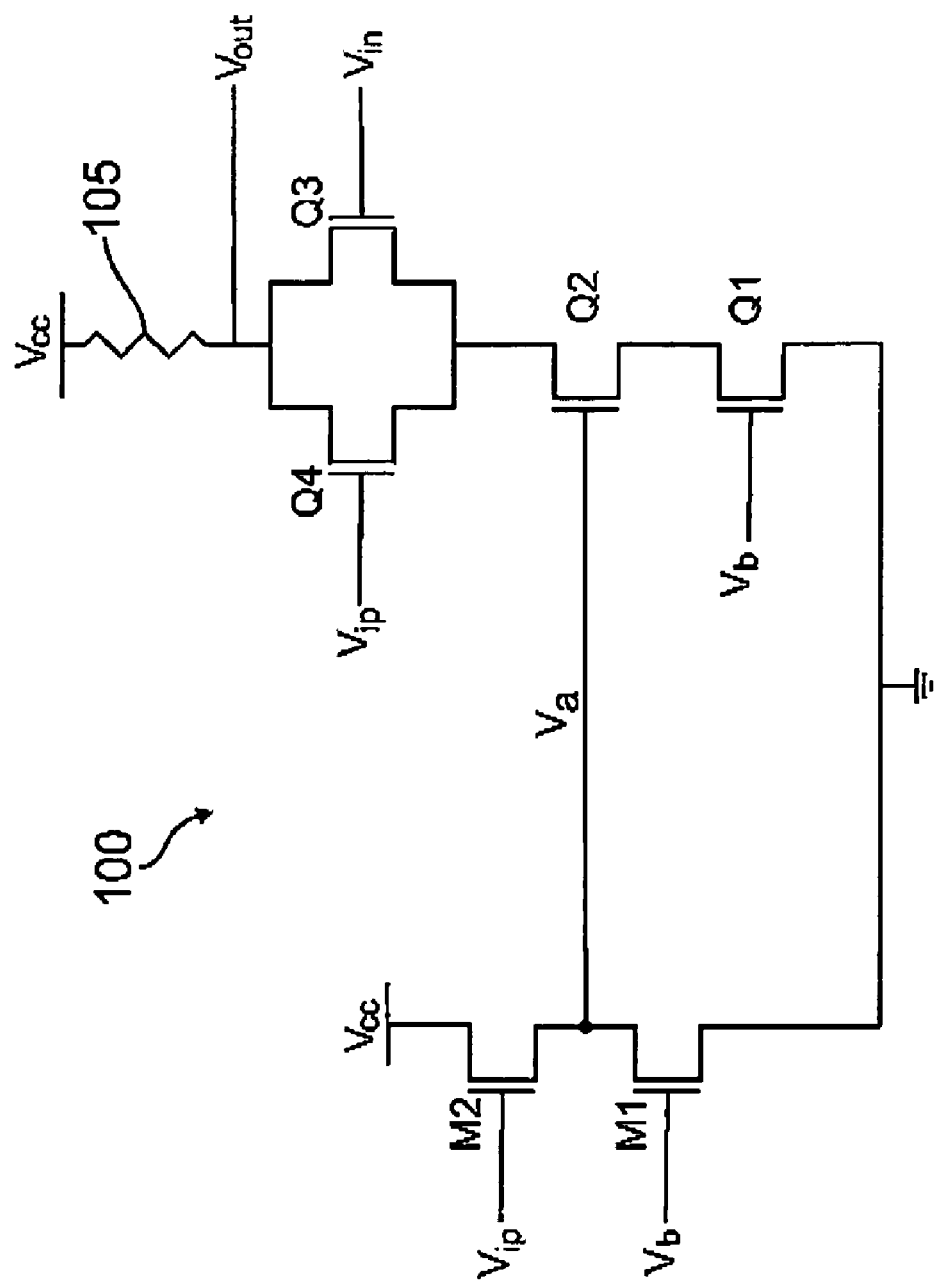
FIG. 1 is a circuit diagram of an example pulse generator.

FIG. 1 illustrates an example pulse generator 100. A differential pair of transistors Q4 and Q3 have their gates driven by complementary rail-to-rail voltages Vip and Vin, respectively. In one embodiment, Vip is periodically asserted for 200 pico-seconds at a 50% duty cycle. Thus, in such an embodiment, Vin would also be asserted for 200 pico-seconds at a 50% duty cycle. The tail current through the differential pair of transistors Q4 and Q2 flows through a transistor Q2 whose gate voltage is driven by a level-shifted version of either Vip or Vin. In pulse generator 100, the gate of transistor Q2 is driven by a level-shifted voltage Va derived from Vip. The drains of Q4 and Q3 are coupled through a resistor 105 to the power supply voltage VCC. Resistor 105 may comprise a transistor biased to operate in the triode mode of operation or other suitable means in the semiconductor arts for forming resistors. The level-shifting for Va and the resistor 105 ensure that Q2 and Q4 will be in the same mode of operation (saturation) when Vip is asserted. In addition, Q2 should be matched to transistors Q4 and Q3 to further ensure this common saturation mode of operation when Vip is asserted. The power supply voltage applied when either of voltages Vip or Vin is asserted depends on the semiconductor manufacturing process used to manufacture the pulse generator. In one embodiment, the power supply may be 3 V such as used in 3V CMOS circuits but it will be appreciated that the power supply voltage may be widely varied depending upon the types of transistors used to implement the pulse generator.

In one embodiment, the level-shifting of voltage Va occurs through series-connected transistors M2 and M1 that couple between the power supply voltage VCC and ground. Va is the source voltage for M2 (or equivalently, the drain voltage for M1). M1 has its gate driven by a constant voltage Vb, which may be derived from a suitable source such as a band gap reference (not illustrated). M2 has its gate driven by the voltage-to-be-level-shifted, which in this embodiment is Vip. It may thus be seen that when Vip is asserted, Va will approximately equal Vip minus the gate-to-source voltage (Vgs) for transistor M2. M1 will act as a current source while Vip is asserted. When Vip is de-asserted (grounded), transistor M2 will no longer conduct. Because the current source transistor M1 will also have to stop conducting at this time despite it constant gate voltage. Thus, the drain voltage of M1 must go low when Vip is brought low, thereby pulling Va low as well.

Figure 2:
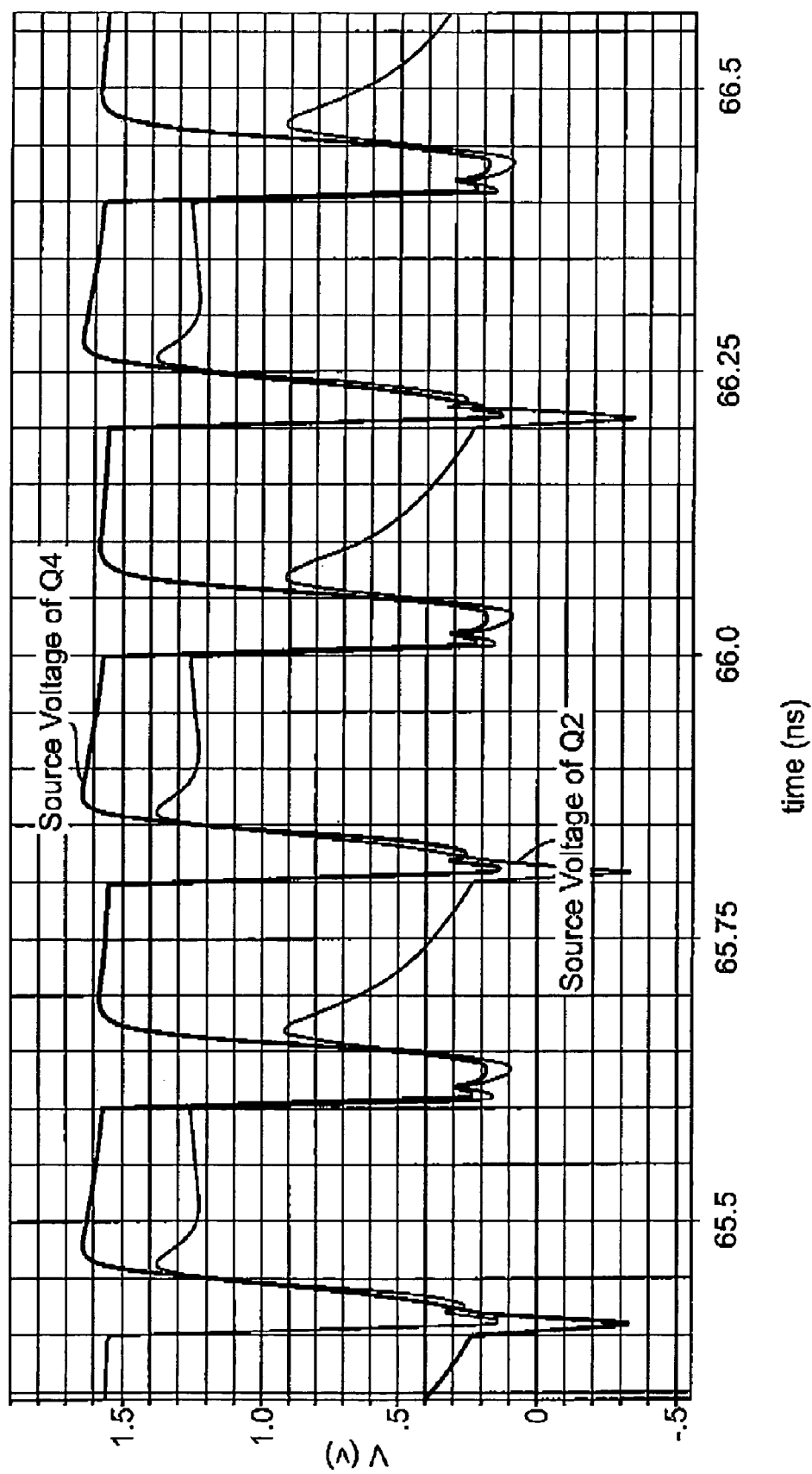
FIG. 2 illustrates simulated waveforms for the voltage at the source of Q4 and the source of Q2 in FIG. 1.
Figure 3:
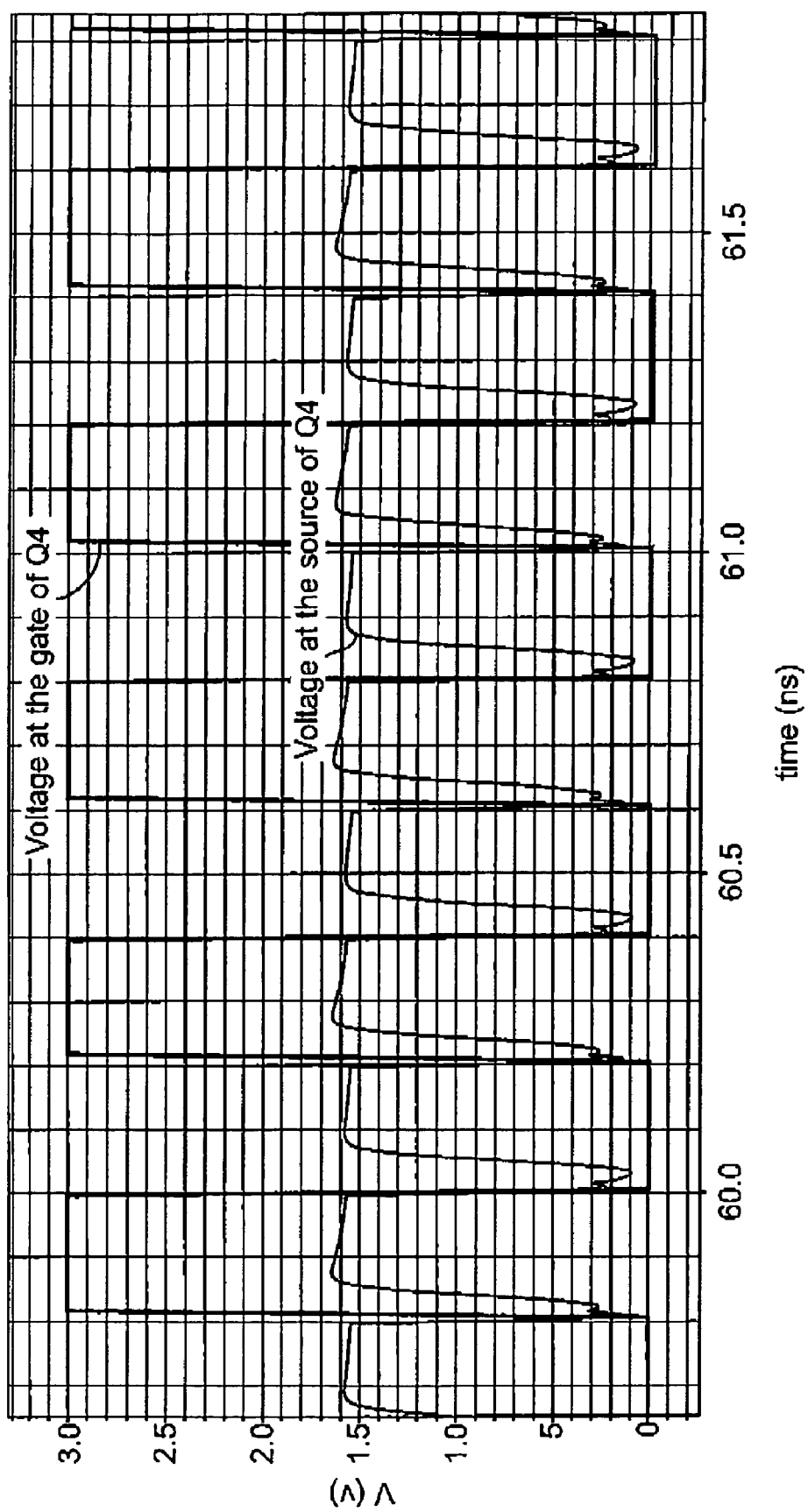
FIG. 3 illustrates the voltage waveforms at the source and gate of Q4 in FIG. 1.

A current source such as a transistor Q1 couples between the drain of Q2 and ground. Analogous to M1, the gate of Q1 may be driven by the constant voltage Vb. It can be seen that the behavior of Q2 and Q1 will be similar to that of M2 and M1, respectively. Thus, Q2 will conduct a current determined by current source transistor Q1 while Vip/Va is asserted. When Vip/Va are brought low, the current source transistor Q1 must stop conducting despite its constant gate voltage. Thus, the drain of Q1 (and thus the source of Q2) will go low in response to Va going low. This abrupt voltage drop at the source of Q2 affects the source of Q4 as well—note that when Vip is asserted, transistors Q2 and Q4 are both in saturation and conducting the tail current determined by current source transistor Q1. The drain currents of Q2 and Q4 will be the same in saturation and are proportional to the quantity $(Vgs-Vt)^2$, where Vgs is the gate-to-source voltage and Vt is the threshold voltage. Because the gate voltage Vip is higher than Va by the Vgs for transistor M2, the source voltage for Q4 will equal the source voltage for Q2 plus the Vgs for M2. Thus, when Vip is brought low, the source voltage for Q4 will also abruptly drop in voltage as shown by the simulation results in FIG. 2 for these source voltages where Vip and Vin each have an on-time of 200 pico-seconds with a rise/fall time of 10 pico-seconds. FIG. 3 illustrates simulation results for the voltage drop at the source of Q4 as compared to its gate voltage for the same driving waveform. This voltage drop form a pulse because transistor Q3 will be transitioning on as Vip is brought low due to complementary voltage Vin being asserted. The source voltage of Q4 will thus start to increase after its abrupt drop to ensure that the drain current of Q3 does not become too large.

Figure 4:
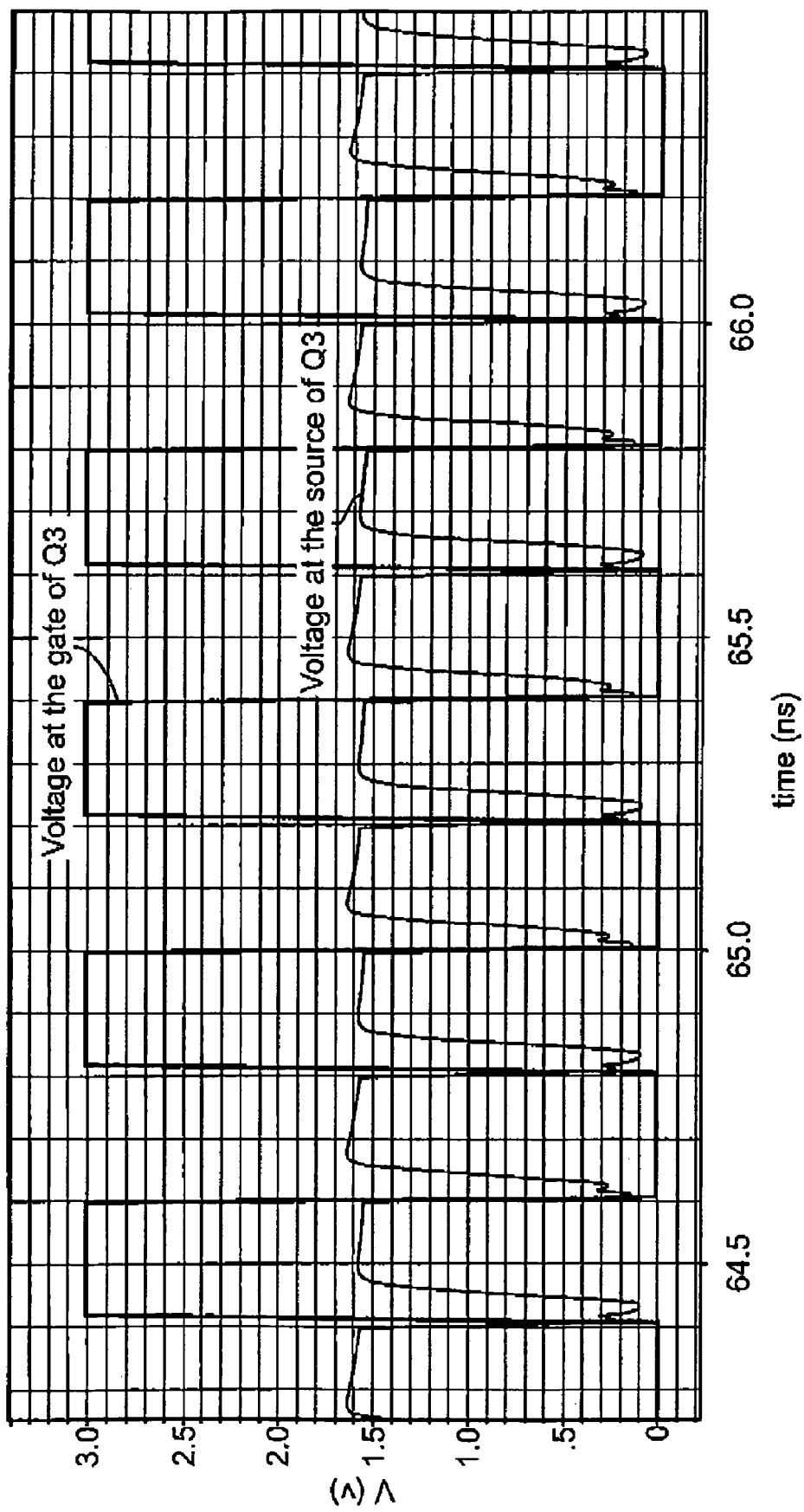
FIG. 4 illustrates the voltage waveforms at the source and gate of Q3 in FIG. 1.

This abrupt voltage pulse at the source of Q4 will also occur as Vip transitions high because the source of Q4 must abruptly drop as Vip rises to supply the current to the turning-on current source transistor Q1 and Q2. It will be appreciated that any real-world voltage has a finite rise time—i.e., Vip cannot instantaneously change from ground to the power supply voltage. As Vip continues to rise high, the source of Q4 must rise from its abrupt voltage drop to limit the drain current flowing through Q4 to the appropriate value as determined by the current source transistor Q1. FIG. 4 illustrates simulation results showing the drop at the source of Q3 as Vin falls (which corresponds to Vip rising). It will thus be seen that the abrupt pulsing change in voltage at the sources of Q3 and Q4 will occur at every transition of Vip (at both the rising and falling edges) as shown by the simulation results of FIGS. 3 and 4.

Advantageously, the abrupt pulsing voltage at the sources of Q4 and Q3 will be as brief as just tens of pico-seconds (such as, for example, 40 pico-seconds) with an amplitude of 1.5 V. Current state of the art clock generation for high-speed data transmission allows a rise and fall time of just 10 picoseconds for a 3V rail-to-rail signal. It will be appreciated that pulse width will be increased if a driving source for Vip and Vin does not offer speedy rise and fall times. In general, it is desired to minimize the rise and fall time for these driving voltages as much as possible. Although pulse generator 100 is shown with all NMOS transistors, those of ordinary skill in the art will appreciate that an analogous PMOS pulse generator may be implemented by replacing the NMOS transistors with PMOS transistors and reversing the power supply and drain nodes.

Figure 5:
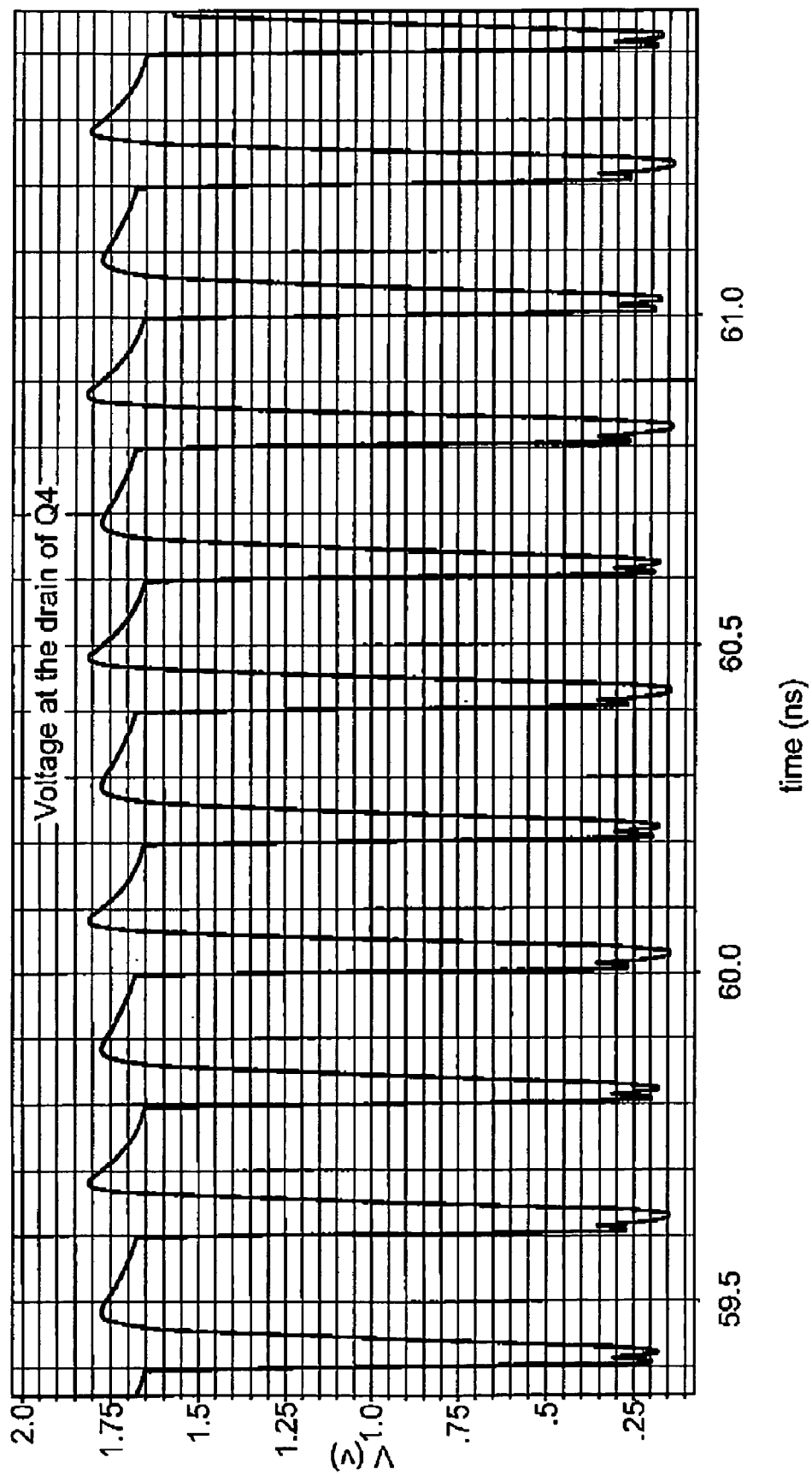
FIG. 5 illustrates the voltage waveform at the drains of Q3 and Q4 in FIG. 1. Embodiments of the present invention and their advantages are best understood by referring to the detailed description that follows. It should be appreciated that like reference numerals are used to identify like elements illustrated in one or more of the figures.

Thus, the voltage at the sources of Q4 and Q3 may be used as an extremely narrow pulse train. It may be seen that the drain voltage of Q4 and Q3 will also mirror their source voltages as shown by the simulation results of FIG. 5. Thus very narrow pulse trains may be obtained at either the drain or the sources of Q4 and Q3. Pulse generator 100 shows an output voltage Vout being derived from the drain of Q4 but it could just have readily been taken at the source. Simulation results show that achieving such narrow pulses is enhanced if Q1 through Q4 are relatively large transistors. For example, the length of Q4/Q3 may be one micron and the width may be 100 microns. Not only do such large transistors enhance narrow pulse formation, the capacitance and other stray effects of whatever circuit that couples to the drain (or source) of Q4 to receive the pulse train will have relatively little effect on the pulse formation.

Although the pulse generators discussed herein have been described with respect to particular embodiments, this description is only an example of certain applications and should not be taken as a limitation. Thus, those of ordinary skill will appreciate that alternative embodiments may be constructed according to the principles discussed above. Consequently, the scope of the claimed subject matter is set forth as follows.

I claim:

1. A pulse generator, comprising:
a differential pair of transistors coupled between a first node and a second node, wherein a first one of the transistors in the pair has its gate driven by a voltage Vip that transitions periodically between a power supply voltage and ground and wherein a remaining one of the transistors has its gate driven by a voltage Vin that is complementary to voltage Vip;
a current source that biases a current that flows between the first and second nodes; and
a third transistor coupled between the current source and the second node, wherein the third transistor is matched to the differential pair of transistors and driven by a level-shifted version of Vip, whereby as Vip is periodically brought low, a voltage pulse occurs at the first and second nodes, and whereby as Vin is periodically brought low, a voltage pulse also occurs at the first and second nodes.

2. The pulse generator of claim 1, further comprising a resistor coupled between the first node and a power supply node.

3. The pulse generator of claim 2, wherein the current source comprises a fourth transistor coupled between the third transistor and a ground potential node, the fourth transistor having its gate driven by a constant voltage.

4. The pulse generator of claim 3, further comprising a source follower adapted to provide the level-shifted version of voltage Vip.

5. The pulse generator of claim 3, wherein the source follower comprises a fifth and sixth transistor coupled in series between a power supply node and a ground node, the sixth transistor having its gate driven by a constant power supply, the fifth transistor having its gate driven by the voltage Vip.

6. The pulse generator of claim 1, wherein the differential pair of transistors comprises a differential pair of NMOS transistors.

7. The pulse generator of claim 1, wherein the differential pair of transistors comprises a differential pair of PMOS transistors.

8. The pulse generator of claim 1, wherein the voltage pulse has a duration of approximately 40 pico-seconds.

9. The pulse generator of claim 1, wherein the voltage pulse has an amplitude of at least one volt.

10. A method of generating pulses for a circuit that includes a differential pair of transistors coupled between a first node and a second node, a first current source that biases a current that flows between the first and second nodes, and a third transistor coupled between the current source and the second node, wherein the third transistor is matched to the differential pair of transistors, the method comprising:
driving a gate of a first one of the transistors in the differential pair with a first square wave voltage that oscillates between ground and a power supply voltage while driving a gate of a remaining one of the transistors in the differential pair with a second square wave voltage that is complementary to the first square wave voltage; and
driving a gate of the third transistor with a level-shifted version of the first square wave voltage, the level-shifting being such that the gate of the third transistor oscillates between a voltage lower than the power supply voltage and ground synchronously with the voltage oscillation at the gate of the first one of the transistor in the differential pair.

11. The method of claim 10, wherein producing the level-shifted version of the first square wave voltage comprises driving a gate of a transistor coupled between a power supply voltage and a current source with the first square wave voltage.

12. The method of claim 10, wherein a period of the first and second square wave voltages is approximately 200 pico-seconds.

13. The method of claim 10, wherein a rise and fall time for the first and second square wave is approximately 10 pico-seconds.

14. The method of claim 10, wherein the power supply voltage is 3 V.

15. The method of claim 10, further comprises: driving an UWB radar to pulse according to voltage oscillations occurring at either the first and second nodes.

* * * * *